(12) United States Patent
Cragnotti et al.

(10) Patent No.: US 10,828,974 B2
(45) Date of Patent: Nov. 10, 2020

(54) ENERGY SOURCE ENCLOSURE SYSTEMS AND METHODS WITH THROUGH-AIR THERMAL MANAGEMENT

(71) Applicant: THE RAYMOND CORPORATION, Greene, NY (US)

(72) Inventors: Joseph E. Cragnotti, Medford, OR (US); Greg Stoermer, Aurora, OR (US); Lawrence O. Hilligoss, Ashland, OR (US)

(73) Assignee: The Raymond Corporation, Greene, NY (US)

( * ) Notice: Subject to any disclaimer, the term of this patent is extended or adjusted under 35 U.S.C. 154(b) by 275 days.

(21) Appl. No.: 15/476,373

(22) Filed: Mar. 31, 2017

(65) Prior Publication Data

US 2017/0290204 A1    Oct. 5, 2017

Related U.S. Application Data

(60) Provisional application No. 62/317,812, filed on Apr. 4, 2016.

(51) Int. Cl.
*H05K 7/20* (2006.01)
*B60L 58/26* (2019.01)
(Continued)

(52) U.S. Cl.
CPC ............... *B60K 1/04* (2013.01); *B60L 50/64* (2019.02); *B60L 50/66* (2019.02); *B60L 58/26* (2019.02);
(Continued)

(58) Field of Classification Search
CPC .............................. H05K 7/20; H05K 1/20909
(Continued)

(56) References Cited

U.S. PATENT DOCUMENTS 1,453,328 A * 5/1923 Smillie ..................... H02K 9/12
                                                    310/58
5,620,057 A * 4/1997 Klemen .................... B60K 1/04
                                                    180/65.1
(Continued)

FOREIGN PATENT DOCUMENTS

DE    102013208019 A1    11/2013
DE    102015114804 A1    3/2016

OTHER PUBLICATIONS

The partial European search report dated Aug. 30, 2017 for European patent application No. 17164789.4.
(Continued)

*Primary Examiner* — Vivek K Shirsat
*Assistant Examiner* — Ko-Wei Lin
(74) *Attorney, Agent, or Firm* — Quarles & Brady LLP

(57) ABSTRACT

Provided are systems and methods for enclosing an energy source of a material handling vehicle. The systems and methods include an enclosure having a front wall, a rear wall, and an interior compartment, an inlet channel integrally formed with the front wall and in fluid communication with the interior compartment, the air inlet channel defined by an inlet louver and an inlet flange, an outlet channel integrally formed with the rear wall and in fluid communication with the interior compartment, the air outlet channel defined by an outlet louver and an outlet flange, one or more energy source cells positioned within the interior compartment; and a cooling fan in fluid communication with the inlet channel and the interior compartment. The cooling fan operates to draw air through the inlet channel to the interior compartment such that air within the interior compartment is expelled out of the outlet channel.

19 Claims, 7 Drawing Sheets

(51) Int. Cl.
*B60K 1/04* (2019.01)
*B66F 9/075* (2006.01)
*H01M 10/6563* (2014.01)
*H01M 10/6556* (2014.01)
*H01M 10/617* (2014.01)
*H01M 10/613* (2014.01)
*H01M 10/625* (2014.01)
*B60L 50/60* (2019.01)
*B60L 50/64* (2019.01)
*B60K 1/00* (2006.01)

(52) U.S. Cl.
CPC ....... *B66F 9/07595* (2013.01); *H01M 10/613* (2015.04); *H01M 10/617* (2015.04); *H01M 10/625* (2015.04); *H01M 10/6556* (2015.04); *H01M 10/6563* (2015.04); *H05K 7/20863* (2013.01); *H05K 7/20909* (2013.01); *B60K 2001/005* (2013.01); *B60K 2001/0405* (2013.01); *B60L 2200/40* (2013.01); *B60L 2200/42* (2013.01); *B60L 2240/545* (2013.01); *B60W 2300/121* (2013.01); *Y02P 90/60* (2015.11); *Y02T 10/705* (2013.01); *Y02T 10/7011* (2013.01); *Y02T 10/7016* (2013.01); *Y02T 90/16* (2013.01)

(58) Field of Classification Search
USPC ........................................................ 454/184
See application file for complete search history.

(56) References Cited

U.S. PATENT DOCUMENTS

| | | | | |
|---|---|---|---|---|
| 5,762,550 A * | 6/1998 | Brunner | ............. | H05K 7/20136 361/695 |
| 5,808,866 A * | 9/1998 | Porter | ................. | H05K 7/1424 174/377 |
| 6,151,212 A * | 11/2000 | Schwenk | ........... | H05K 7/20572 165/122 |
| 6,264,551 B1 * | 7/2001 | Smith | ................... | F24F 13/068 454/245 |
| 6,407,533 B1 * | 6/2002 | Bartek | ............... | H05K 7/20618 320/150 |
| 6,462,944 B1 * | 10/2002 | Lin | ........................ | G06F 1/181 165/80.3 |
| 6,643,130 B1 * | 11/2003 | DeMarchis | ........ | H05K 7/20181 165/80.3 |
| 6,704,198 B2 * | 3/2004 | Replogle | ................ | H05K 7/186 165/104.33 |
| 6,742,583 B2 * | 6/2004 | Tikka | ..................... | H05K 7/206 165/261 |
| 6,877,551 B2 * | 4/2005 | Stoller | ................... | H02B 1/565 165/122 |
| 6,978,824 B2 * | 12/2005 | Sato | .................... | B60R 16/0239 165/41 |
| 7,573,713 B2 * | 8/2009 | Hoffman | ............ | H05K 7/20136 165/80.3 |
| 7,714,731 B2 * | 5/2010 | Palaszewski | .......... | H05K 7/207 236/49.2 |
| 7,817,419 B2 * | 10/2010 | Illerhaus | ................... | H02J 7/35 165/104.33 |
| 8,122,627 B2 * | 2/2012 | Miller | ....................... | G09F 9/33 312/265.5 |
| 8,424,885 B2 * | 4/2013 | Woodbury, II | ....... | B62B 5/0026 280/47.34 |
| 8,540,557 B1 * | 9/2013 | Derks | ..................... | F24F 13/24 454/184 |
| 8,685,556 B2 * | 4/2014 | Minokawa | .......... | H01M 2/1077 429/120 |
| 8,920,224 B2 * | 12/2014 | Pucciani | ............... | F04D 29/663 454/56 |
| 9,155,228 B2 * | 10/2015 | Hill | ..................... | H05K 7/20618 |
| 9,236,589 B2 * | 1/2016 | Lee | ..................... | H01M 2/1072 |
| 9,387,906 B2 | 7/2016 | Rasmussen | | |
| 9,425,628 B2 | 8/2016 | Pham et al. | | |
| 2004/0007347 A1 * | 1/2004 | Stoller | ................. | H05K 7/206 165/47 |
| 2004/0232891 A1 | 11/2004 | Kimoto et al. | | |
| 2006/0093901 A1 * | 5/2006 | Lee | ..................... | H01M 2/1072 429/120 |
| 2008/0233858 A1 * | 9/2008 | Womac | ................ | H05K 7/1425 454/184 |
| 2009/0017366 A1 * | 1/2009 | Wood | .................. | B60L 11/1874 429/62 |
| 2009/0088066 A1 * | 4/2009 | Zuzek | ..................... | B67D 7/84 454/184 |
| 2012/0068668 A1 * | 3/2012 | Kittell | ................. | B60L 11/185 320/162 |
| 2012/0244404 A1 * | 9/2012 | Obasih | ................. | B60L 3/0046 429/99 |
| 2013/0280577 A1 * | 10/2013 | Shin | .................... | H01M 2/0277 429/120 |
| 2013/0302653 A1 * | 11/2013 | Pham | ....................... | H02J 7/00 429/50 |
| 2015/0303423 A1 * | 10/2015 | Okuyama | ................ | B60K 1/04 187/233 |
| 2016/0137084 A1 * | 5/2016 | Shinada | ............. | H05K 7/20909 320/107 |

OTHER PUBLICATIONS

Extended European Search Report issued in corresponding European Application No. 17164789.4, dated Jan. 5, 2018, 9 pages.

* cited by examiner

ENERGY SOURCE ENCLOSURE SYSTEMS AND METHODS WITH THROUGH-AIR THERMAL MANAGEMENT

CROSS REFERENCE TO RELATED APPLICATIONS

This application claims priority to U.S. Provisional Application No. 62/317,812 filed on Apr. 4, 2016, and titled "Systems and Methods for Energy Source Enclosure with Through-air Thermal Management," which is hereby incorporated by reference.

STATEMENT OF FEDERALLY SPONSORED RESEARCH OR DEVELOPMENT

Not applicable.

FIELD OF THE INVENTION

The present invention relates to systems and methods of enclosing one or more energy source cells while providing through air thermal management for the energy source cells and other components.

BACKGROUND

Material handling vehicles are commonly found in warehouses, factories, shipping yards, and, generally, wherever pallets, large packages, or loads of goods are required to be transported from place to place. Material handling vehicles typically include load bearing forks for lifting packages or pallets for transporting, a drive motor for propelling the truck, a steering control mechanism, and a brake.

A common energy source for electrically based material handling equipment is a lead acid battery (LAB). However, improvements in alternative energy source technology have led to other energy sources being used, such as lithium ion batteries (LIBs) and fuel cells.

Importantly, existing battery enclosure systems do not provide for the cooling necessary for some components while allowing the enclosure to be subjected to a water wash-down. Therefore, it is desirable to provide a battery enclosure system that adequately provides for thermal cooling for components within the enclosure while allowing a water wash-down.

SUMMARY OF THE INVENTION

The present invention provides for systems and methods for enclosing components of a battery while allowing for through air cooling.

In one form, a system for enclosing an energy source includes an enclosure having a front wall, a rear wall, a top wall, a bottom wall, side walls and forming an interior compartment. The system further includes an inlet channel integrally formed with the front wall and in fluid communication with the interior compartment, the inlet channel defined by an inlet louver and an inlet flange, the inlet flange defined by two or more inlet segments, and an outlet channel integrally formed with the rear wall and in fluid communication with the interior compartment, the outlet channel defined by an outlet louver and an outlet flange, the outlet flange defined by two or more outlet segments. The system also includes one or more energy source cells positioned within the interior compartment and a cooling fan in fluid communication with the inlet channel and the interior compartment. The cooling fan operates to draw air through the inlet channel to the interior compartment such that air within the interior compartment is expelled out of the outlet channel. In another embodiment, the system includes a charger positioned within the enclosure being electrically coupled with the one or more energy source cells. In still a further form, the system includes a battery management system positioned within the enclosure being electrically coupled with the one or more energy source cells.

In some embodiments, the one or more energy source cells are positioned below the battery management system and the charger within the enclosure. In another form, the system includes an electrical cord coupled with the charger. In another form, the system includes a recessed compartment formed within a top wall of the enclosure and the electrical cord is retractable into the compartment. In still another form the system includes a wall aperture formed within a side wall of the enclosure that allows water that pools within the compartment to flow out of the compartment.

In yet another form, the system includes one or more drainage holes formed within a bottom wall of the enclosure. In some embodiments, the one or more energy source cells include a first energy source cell and a second energy source cell. In some embodiments, the first energy source cell is a lithium ion battery cell and the second energy source cell is a lithium ion battery cell.

In some embodiments, a system for enclosing an energy source for a material handling vehicle includes an enclosure having a first wall, a second wall, and an interior compartment. The system also includes an inlet channel integrally formed with the front wall and in fluid communication with the interior compartment and an outlet channel integrally formed with the rear wall and in fluid communication with the interior compartment. The system also includes one or more energy source cells positioned within the interior compartment, a charger positioned within the enclosure being electrically coupled with the one or more energy source cells, and a battery management system positioned within the enclosure being electrically coupled with the one or more energy source cells. The system also includes a cooling fan in fluid communication with the inlet channel and the interior compartment such that the cooling fan operates to draw air through the inlet channel to the interior compartment such that air within the interior compartment is expelled out of the outlet channel.

In some embodiments, all mechanical aspects of the enclosure have at least an IP3X Ingress Protection rating. In some embodiments, the system includes an air inlet louver positioned adjacent the inlet channel and an air outlet louver positioned adjacent the air outlet channel. In still some embodiments, the cooling fan is positioned in an upper corner of the enclosure and the one or more energy source cells are positioned in one or more lower corners of the enclosure.

In another embodiment, a method of enclosing an energy source of a material handling vehicle and providing cooling thereto includes drawing air through an air inlet channel of an enclosure defined by at least a front wall and a rear wall via a cooling fan, propelling the air into an interior compartment of the enclosure such that the air flows past one or more energy source cells, a charger, and a battery management system, expelling air out of an outlet channel that is integrally formed with the rear wall and in fluid communication with the interior compartment. The air inlet channel is defined by an inlet louver and an inlet flanged defined by two or more inlet segments, and the outlet channel is defined by an outlet louver and an outlet flange defined by two or more outlet segments. In some embodiments, the method includes draining moisture out of the interior compartment through one or more drainage holes positioned within a bottom wall of the enclosure. In some embodiments, the method includes retracting a power cord that emanates from a compartment within a recessed compartment formed within a top wall of the enclosure when the charger is not in use. In still some embodiments, the method includes draining water out of the compartment through a wall aperture formed along a side wall of the enclosure.

DETAILED DESCRIPTION

Figure 1:
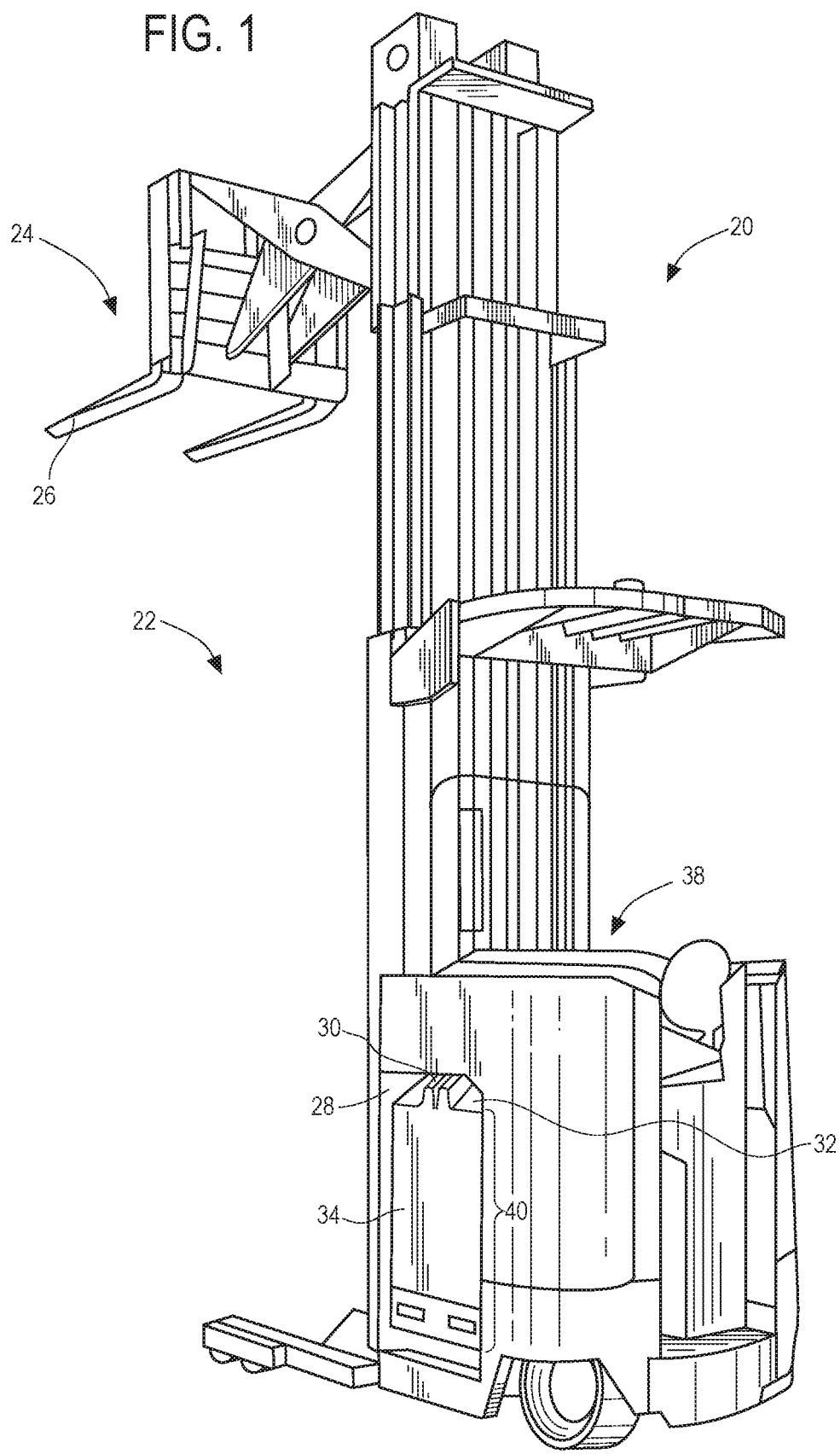
FIG. 1 is a perspective view of a material handling vehicle using a battery according to the present disclosure.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

It is also to be appreciated that material handling vehicles are designed in a variety of configurations to perform a variety of tasks. Although the material handling vehicle described herein is shown in the figure as a reach truck, it will be apparent to those of skill in the art that the present invention is not limited to vehicles of this type or purpose, and can also be provided in various other types of material handling vehicle configurations, including, for example, pallet trucks, order pickers, narrow-aisle turret trucks, and any other material handling vehicle.

Turning to the figures, the following description and drawing figures pertain to an embodiment of the invention directed toward an enclosure with through-air thermal management for a battery pack that powers a material handling vehicle. The energy source cells that provide energy for the material handling vehicles that are positioned within the enclosure described herein may be comprised of one or more of the following, but are not limited to: a lead acid battery; a flow battery such as a vanadium redox battery, a zinc-bromine battery, or a zinc-cerium battery; a lithium air battery; a lithium-ion battery such as a beltway battery, a lithium ion manganese oxide battery, a lithium ion polymer battery, a lithium iron phosphate battery, a lithium-sulfur battery, or a lithium-titanate battery; a molten salt battery; a nickel-cadmium battery; a nickel hydrogen battery; a nickel-iron battery; a nickel metal hydride battery; an organic radical battery; a polymer-based battery; a polysulfide bromide battery; a potassium-ion battery; a rechargeable alkaline battery; a rechargeable fuel battery; a silicon air battery; a silver-zinc battery; a silver calcium battery; a sodium-ion battery; a sodium-sulfur battery; a sugar battery; a super iron battery; or an UltraBattery.

Improvements in battery technology have allowed the battery cells that provide energy to material handling vehicles to be miniaturized such that the battery cells provide the same amount of energy without requiring the space that previous batteries required. As a result, other components, such as a battery management system, a charger, or other battery components, can be included within the enclosure that surrounds the energy source.

Referring to FIG. 1, a material handling vehicle 20 embodying an aspect of the invention is shown. The material handling vehicle 20 includes a body 22, a fork carriage 24 with at least one load bearing fork 26, a motor compartment (not shown) housing a motor (not shown), an energy source compartment 28 for housing an energy source 30. The energy source 30 is comprised of at least one battery pack 32. In some embodiments, the energy source 30 may be comprised of a plurality of battery packs 32. As illustrated in FIG. 1, the battery pack 32 is shown positioned within a counter weight 34. The material handling vehicle 20 may further include an operator compartment 38. The energy source 30 and the counter weight 34 are collectively referred to as a battery 40. The material handling vehicle 20 is shown with the fork carriage 24 in an uppermost position.

Figure 2:
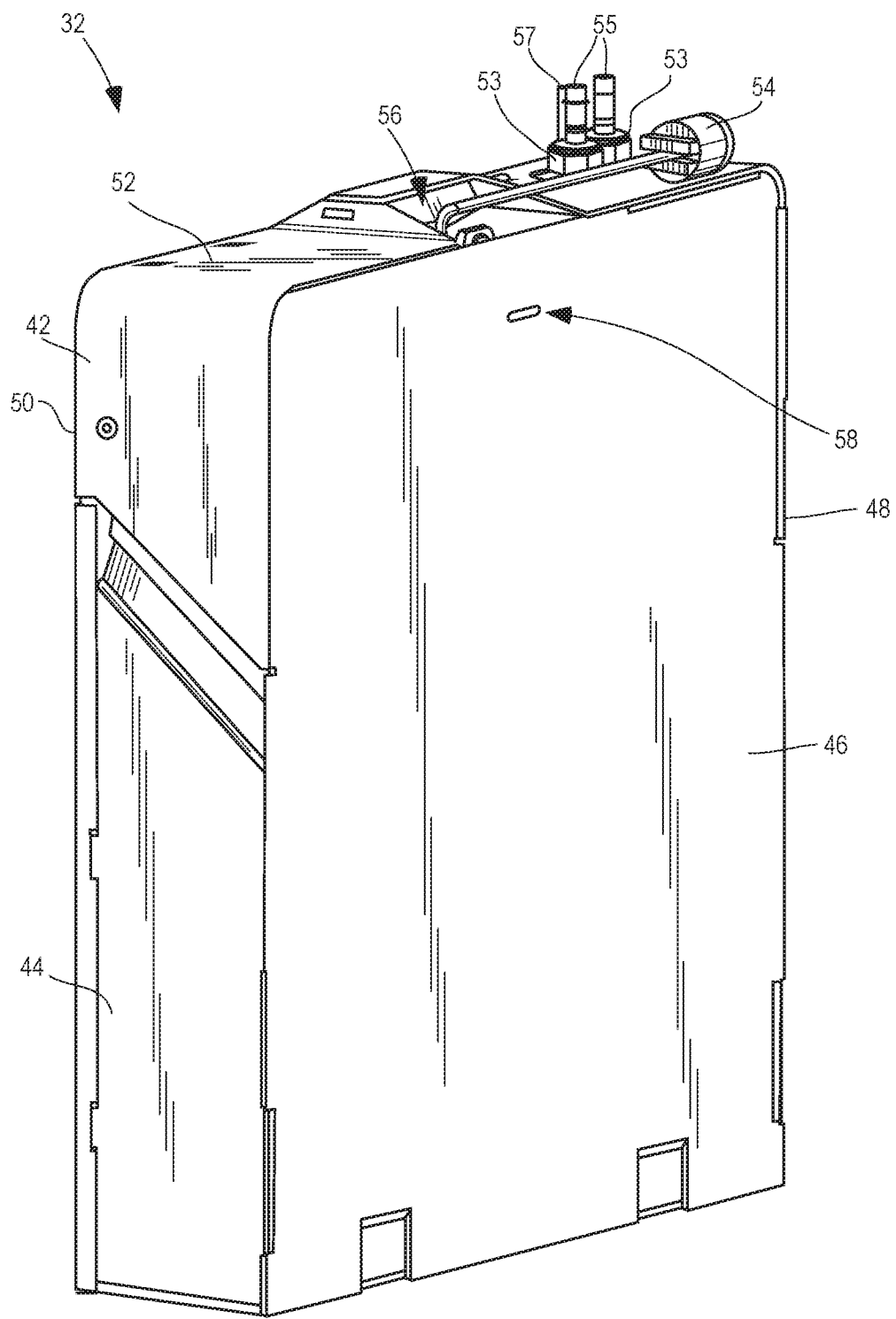
FIG. 2 is a front, left isometric view of an enclosure surrounding a battery pack as disclosed herein.
Figure 3:
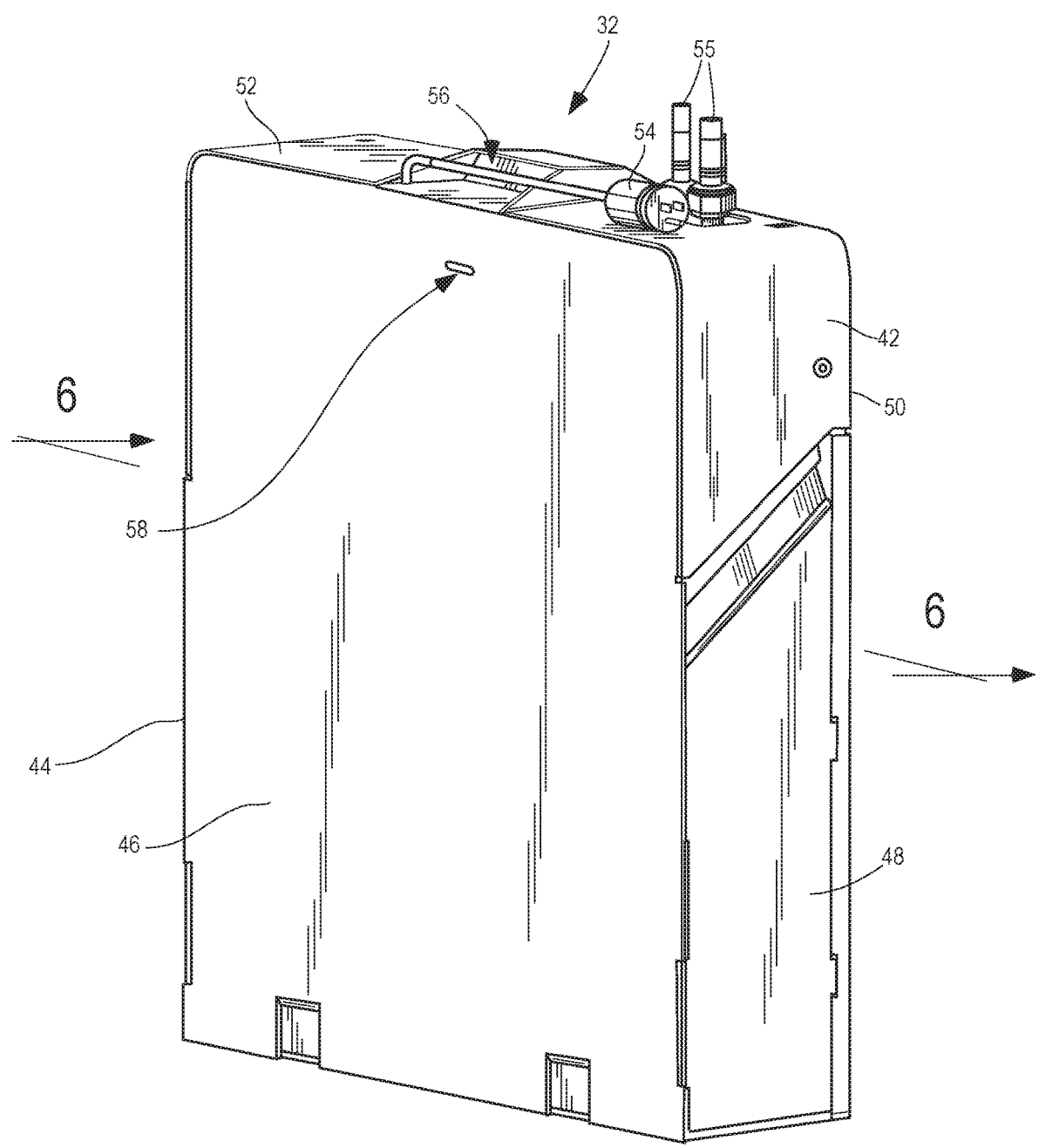
FIG. 3 is a rear, left isometric view of the enclosure of FIG. 2.

As illustrated in FIGS. 2 and 3, the battery pack 32 is surrounded by a battery enclosure 42. In some embodiments and as shown in the FIGS., the battery enclosure 42 is defined by a front wall 44, a left wall 46, a rear wall 48, a right wall 50, a top wall 52, and a bottom wall 124 (see FIG. 6). Further, an electrical cord 54 can extend from a compartment 56 within the top wall 52. The electrical cord 54 may be retractable or non-retractable. In some embodiments, a cable gland can be used to seal the electrical cord 54 passing through the top wall 52. Cable glands may also be used for power and communication cables passing through the top wall 52, or any other wall. In some embodiments and as described in greater detail below, the compartment 56 can have a slanted bottom surface that allows water that may build up within the compartment 56, e.g., during washing of the battery pack 32, to flow out of a wall aperture 58.

Figure 4:
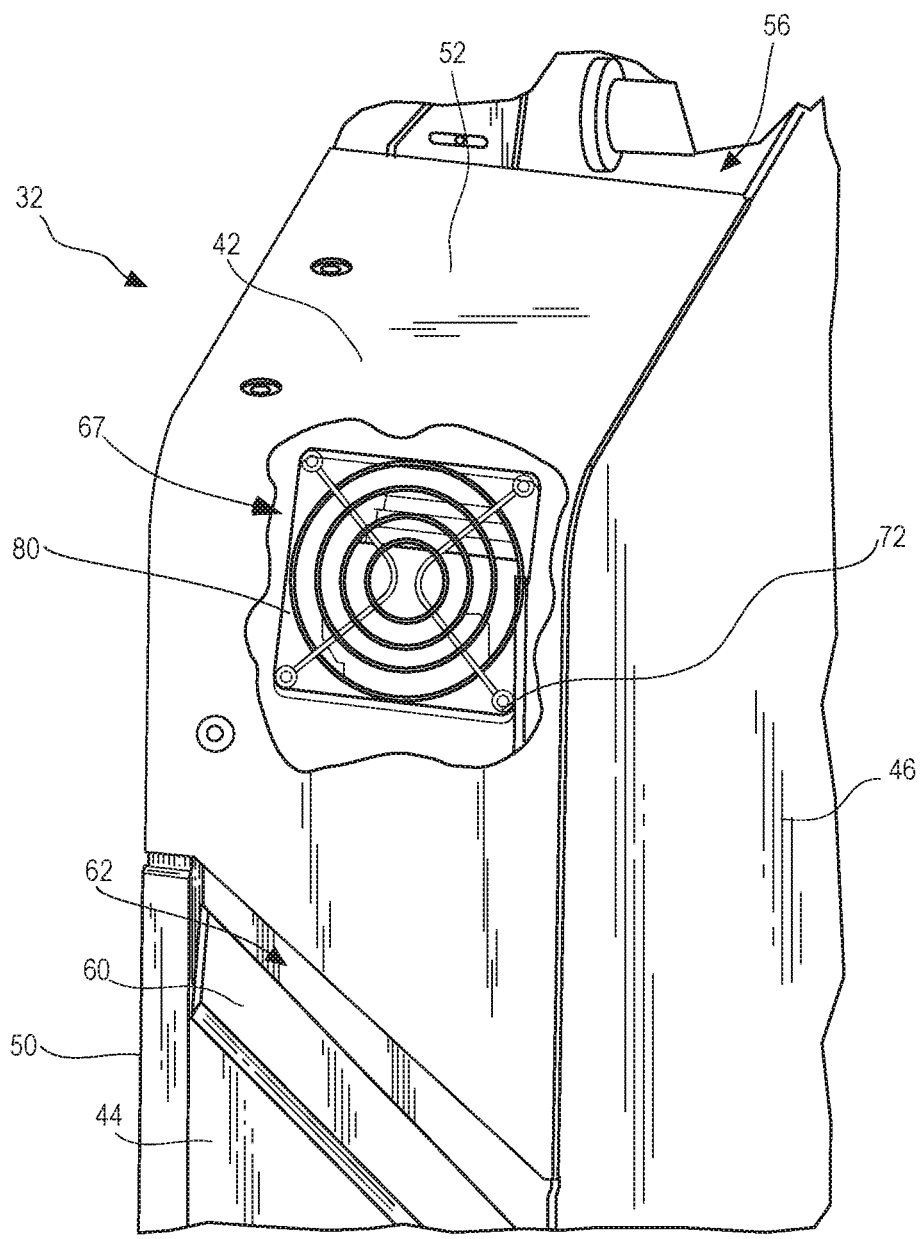
FIG. 4 is a partial front, left isometric view of the enclosure of FIG. 2.
Figure 5:
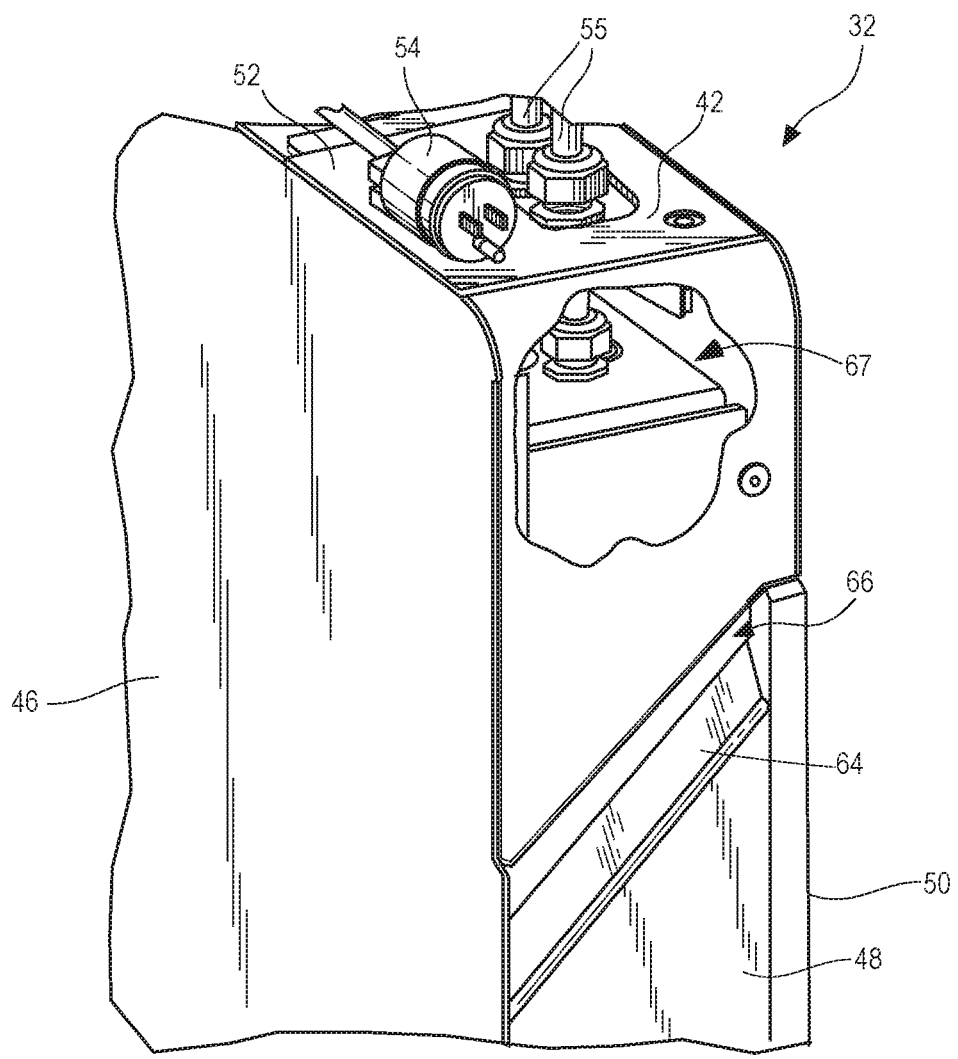
FIG. 5 is a partial rear, left isometric view of the enclosure of FIG. 2.

Referring now to FIGS. 4 and 5, the battery enclosure 42 also includes an inlet louver 60 that defines an air inlet 62 and further includes an outlet louver 64 that defines an air outlet 66. Both the inlet louver 60 and the outlet louver 64 can be angled slats or flat strips that allow air to pass through the front and rear walls of the enclosure. In other embodiments, the louvers 60, 64 may have other forms known to those of ordinary skill in the art. The configuration of the inlet louver 60 and the outlet louver 64 can prevent water at a pressure from entering the interior of the battery enclosure 42 and allows air to enter the air inlet 62 and the air outlet 66, as will be described in greater detail hereinafter below.

The air inlet 62 and/or the air outlet 66 may be formed in any shape known to those skilled in the art. For example, the air inlet 62 and/or the air outlet 66 may be in the shape of a triangle, a square, a rectangle, a circle, an oval, a hexagon, or any other polygonal shape known to those of ordinary skill in the art. In some embodiments, the air inlet 62 and/or the air outlet 66 have a width dimension of between about 0.5 cm to about 5 cm, or between about 1 cm to about 4 cm, or about 1.5 cm or more or less. In some embodiments, the air inlet 62 and/or the air outlet 66 have a length dimension of between about 5 cm and about 15 cm, or between about 8 cm and about 12 cm, or about 10.5 cm or more or less.

Figure 6:
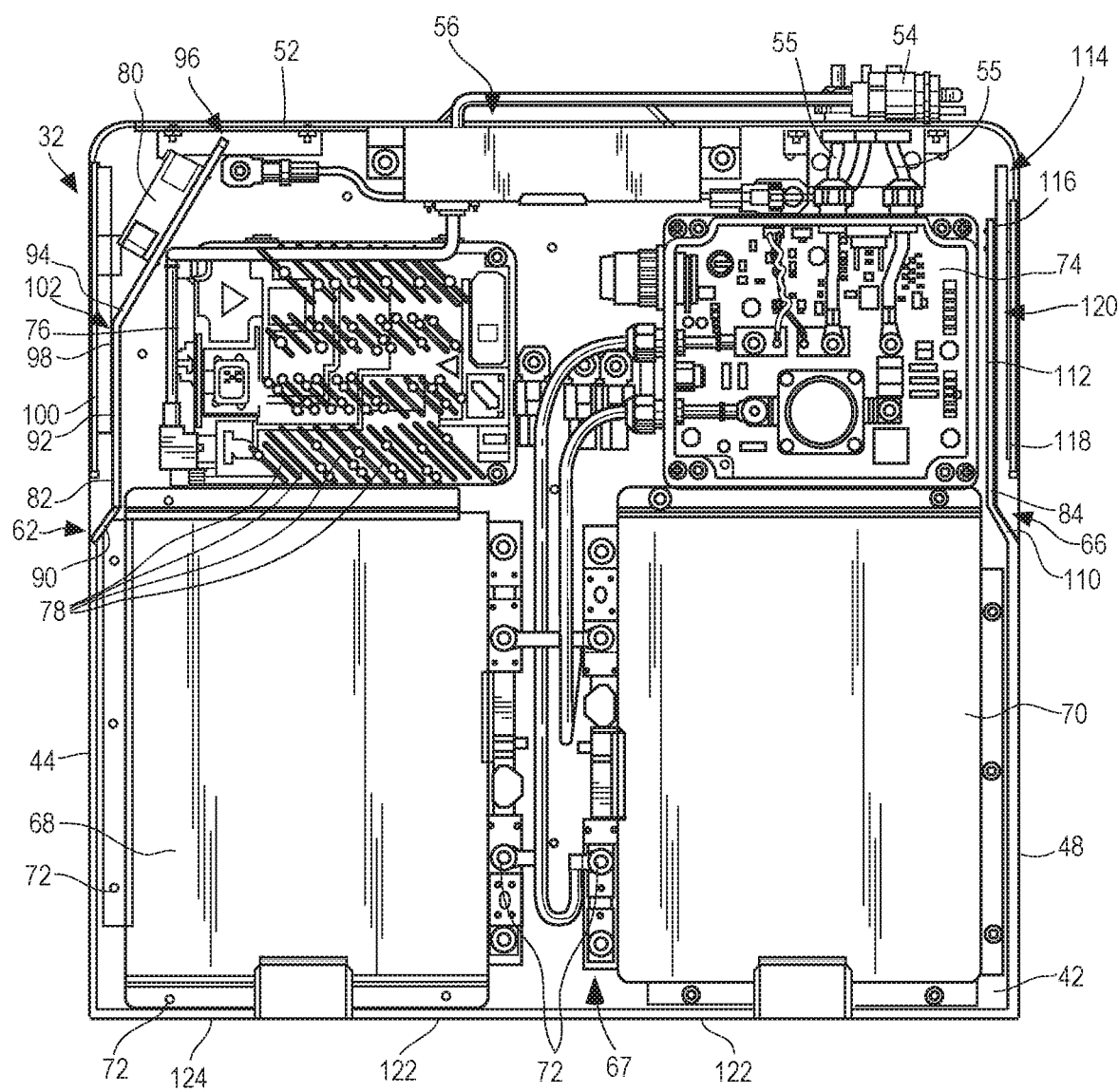
FIG. 6 illustrates a cross sectional view of the enclosure and battery pack as disclosed herein taken through line 6-6 of FIG. 3.

Referring now to FIG. 6, a cross section of the battery pack 32 is shown taken through line 6-6 of FIG. 3. Within the enclosure 42 is a first battery cell 68 and a second battery cell 70, which are both connected to the battery enclosure 42 with a plurality of connectors 72. More or less battery cells are contemplated. The connectors 72 may be screws, rivets, pins, or any other connector known to those of ordinary skill in the art. Further illustrated in FIG. 6 is a battery management system 74 and a charger 76. The charger 76 can have disposed thereon a plurality of fins 78. In some embodiments, a single battery cell may be used. In some embodiments where a single battery cell is used rather than two or more battery cells, the battery cell may be positioned where the second battery cell 70 is positioned within the enclosure 42.

The fins 78 can direct air flow received from a cooling fan 80 across one or more surfaces of the charger and downward toward the first battery cell 68 and the second battery cell 70. The fins 78 may have an angular configuration that is approximately 45 degrees from a plane that is perpendicular to the top wall 52. The fins 78 may also have an angular configuration of between zero degrees and about 90 degrees. The fins 78 can act as cooling fins and can help to cool the charger 76. In some embodiments, the plug 54 for the charger 76 can be plugged into a 120V outlet. In other embodiments, the charger 76 can be plugged into a 240V outlet, or into an outlet having other voltages known in the art. Further included within the enclosure 42 can be the cooling fan 80. In some embodiments, the cooling fan 80 can be energized based on a sensed temperature with the enclosure 42. In other embodiments, the cooling fan 80 may not be included inside the enclosure and air flow may be achieved by convection or by some other means. The cooling fan 80 may also be located along or within a different portion of the enclosure 42. In some embodiments, the fan may be included along one or more of the walls 44, 46, 48, 50, and 52.

As further illustrated in FIG. 6, an inlet flange 82 and an outlet flange 84 are shown, which can help direct the flow of air through the battery enclosure 42 to cool one or more components of the battery pack 32. The inlet flange 82 can comprise one or more inlet segments. The front wall 44 can be coincident with an angled inlet segment 90 of the inlet flange 82, which can protrude upward and inward toward the compartment 56 and can intersect a vertical inlet segment 92. The vertical segment 92 can extend upward toward the top wall 52 where it can intersect with a fan inlet segment 94. The fan segment 94 can also be angled upward and inward, although not required, and can terminate spaced apart from the top wall 52 of the enclosure 42 creating a gap 96. The gap 96 may allow for air to flow there through. In some embodiments, the gap 96 is positioned to prevent water from entering an interior of the casing 45. An outer side 98 of the vertical segment 92 and an inner side 100 of the front wall 44 of the enclosure 42 form an inlet channel 102 through which air is drawn into the enclosure 42 when the cooling fan 80 is turned on or when air is drawn through by some other means.

The cooling fan 80 can be secured to the fan inlet segment 94 with one or more connectors 72 or by some other connection means, to allow air to pass through the fan and through the fan inlet segment 94. In some embodiments, the cooling fan 80 can be secured to the fan inlet segment 94 by a snap fit, an interference fit, adhesion, or any other method of coupling known to those skilled in the art. In some embodiments, there is no gap 96, rather, the fan inlet segment 94 terminates into the top wall 52 of the battery pack 32. In some embodiments, any of the inlet segments 90, 92, 94 of the inlet flange 82 can be either formed with, or connected to, both the right wall 46 and the left wall 50 of the battery pack 32. The inlet segments 90, 92, 94 can be secured in an airtight fashion such that any air that is drawn through the air inlet 62, along the inlet segments 90, 92, 94 and into the cooling fan 80, does not escape into the battery pack 32 without being drawn through at least one of the cooling fan 80 or the gap 96. In other embodiments, the inlet segments 90, 92, 94 are not airtight, and air can escape through the sides thereof. The inlet segments 90, 92, 94 can be a unitary element, or individual elements.

Still referring to FIG. 6, the outlet flange 84 can also comprise one or more outlet segments. An angled outlet segment 110 can be coincident with the rear wall 48 and can extend inward and upward toward the compartment 56. A vertical outlet segment 112 can extend from an end of the angled segment 110 upward toward the top wall 52. The vertical segment 112 can terminate spaced apart from the top wall 52 to form a gap 114. The outlet segments 110, 112 of the outlet flange 84 can be connected to both the right wall 46 and the left wall 50 of the enclosure 42 in an airtight fashion. In some embodiments, the outlet segments 110, 112 can be connected to the walls 46, 40 in a non-airtight fashion. An outer side 116 of the vertical segment 112 and an inner side 118 of the rear wall 48 can form an outlet channel 120 through which air is expelled from the enclosure 42 when the cooling fan 80 is turned on. The outlet flange 84 may include one or more additional segments that can provide for additional or different air flow pathways. The outlet segments 110, 112 may comprise a unitary element, or may comprise separable elements.

In some embodiments, one or more drainage holes 122 can be provided along a bottom wall 124 of the battery enclosure 42. The drainage holes 122 can allow moisture to escape from the battery pack 32. In some embodiments, the drainage holes 122 can be provided in one location along the bottom wall of the battery enclosure 42. In other embodiments, the drainage holes can be provided at two or more locations along the bottom wall of the battery enclosure 42. As illustrated in FIG. 6, the drainage holes can be provided in two locations. The first location can be generally below the first battery cell 68 and the second location can be generally below the second battery cell 70.

The one or more drainage holes 122 may be formed in any shape known to those of ordinary skill in the art, such as, but not limited to, the shape of a triangle, a square, a circle, a rectangle, or any other polygonal shape. The one or more drainage holes 122 may have at least one dimension, i.e., a length, a width, a diameter, or any other dimension, of between about 0.1 cm and about 8 cm, or between about 1 cm and about 6 cm, or between about 2 cm and about 5 cm or more or less. In some embodiments, the drainage holes 122 can be rectangular and can have dimensions of about 2.5 cm by about 5 cm.

Figure 7:
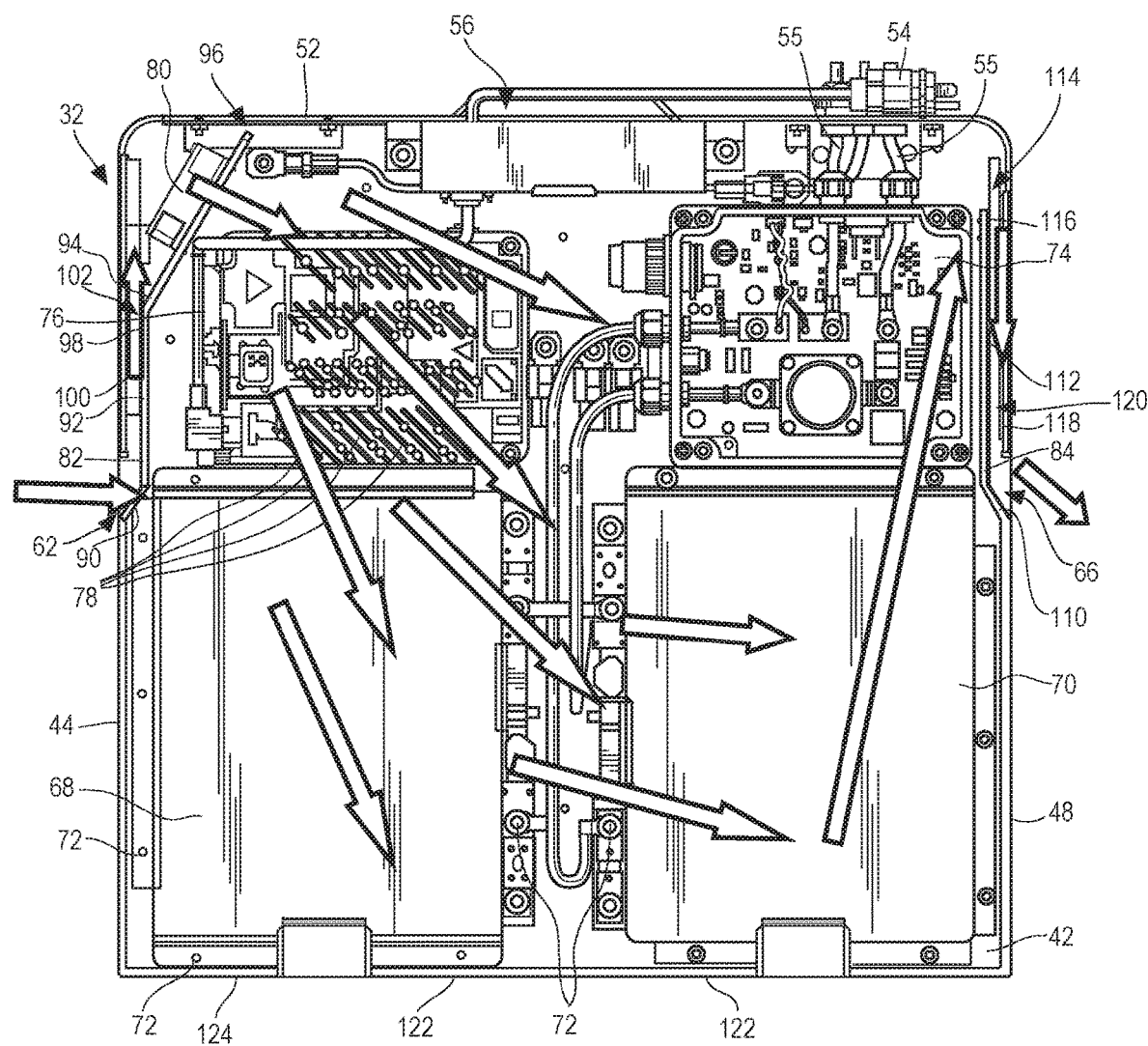
FIG. 7 is a cross sectional schematic view illustrating the flow of air through the enclosure and battery pack of FIG. 6.

Now referring to FIG. 7, a schematic of the air flow through the battery enclosure 42 is shown. As illustrated by the arrows that represent the air flow, air entering through the air inlet 62 is directed through the inlet channel 102 upward along the segments 90, 92, 94 of the inlet flange 82. The air can then be drawn through the cooling fan 80 and can be projected into the interior of the enclosure 42. In some embodiments, the air can be first directed over the charger 76, which may produce thermal output within the enclosure during certain time periods, such as when the battery pack 32 is being charged. While the air is directed over the charger 76, the air can flow laterally through the fins 78 of the charger 76. The fins 78 of the charger 76 may be formed in any configuration that provides for air flow over the charger 76. In some embodiments, the layout of components within the enclosure can be based on the thermal output of the components. In order to reduce convection heating, components that produce a higher thermal output can be placed lower or lowest in the enclosure 42.

Still referring to FIG. 7, some of the air that is drawn through the cooling fan 80 can flow toward the battery management system 74, which can provide cooling thereto. Other air can flow along the sides of the first battery cell 68 and/or along the sides of the second battery cell 70. It should be noted that in some embodiments, the battery enclosure 42 is not hermetically sealed, therefore air can escape through any gap along any of the walls 44, 46, 48, 50, 52, 124 of the enclosure 42. In some embodiments, the battery enclosure 42 can be hermetically sealed or partially hermetically sealed to allow for air to escape through certain portions, but not other portions of the enclosure 42.

Still referring to FIG. 7, in some embodiments, the air that has cooled or otherwise passed over one or more components of the battery pack 32 within the battery enclosure 42 can be directed out of the enclosure 42 through the air outlet 66 via the outlet channel 120. After the air flows into the outlet channel 120, the air can flow downward along the outlet flange 84 and can flow into the surrounding atmosphere through the air outlet 66. While the air flow schematic illustrated in FIG. 7 illustrates air moving from an upper left portion of the enclosure downward along the components of the battery pack 32 and out of the enclosure 42 through the air outlet 66 in the upper right hand corner, other air flow configurations are possible.

For example, the air outlet 66 may be positioned at a different point along one or more of the right wall 46, the left wall 50, the top wall 52, or at a different point along the rear wall 48. Further, the air inlet 62 may be positioned at a different point along one or more of the right wall 46, the left wall 50, the top wall 52, or at a different point along the front wall 44. More than one air inlet 62 and/or one air outlet 66 may be included within the enclosure 42. For example, the enclosure 42 may include two or more air inlets 62 and/or two or more air outlets 66.

The configuration of the segments 90, 92, 94 of the inlet flange 82, and of the segments 110, 112 of the outlet flange 84 can prevent water at a certain pressure or within a range of pressures from entering the enclosure 42 during cleaning or spraying of the battery pack 32. As a result, the enclosure 42 can be wash-down proof. In other embodiments, the segments 90, 92, 94, 110, 112 may be positioned in other configurations. In still further embodiments, more segments may be included to further minimize the amount of water that can reach the interior of the enclosure 42. For example, one or more baffles (not shown) may be provided adjacent one or more of the segments 90, 92, 94, 110, 112 that may direct air flow.

The advantages of the design of the battery enclosure 42 as described herein include allowing the flow of air within the enclosure 42 to cool the system via an indirect flow path. In some embodiments, the temperature rating of some or all components can be in excess of 140 degrees Celsius. With respect to Ingress Protection (IP) ratings, in some embodiments, the battery pack 32 as described herein can satisfy at least the IP3X requirements. In some embodiments, the battery pack 32 can satisfy the IP4X requirement. In still some embodiments, the battery pack 32 can satisfy the IPX6 test criteria. In other embodiments, the battery pack 32 can satisfy up to or more than the IPX9 test criteria.

The enclosure 42 and other components within the enclosure 42 may be made of any material known to those skilled in the art. In some embodiments, the enclosure 42 is made of one or more of a wide variety of well-known polymeric materials, including, for example, polyethylene (PE), low density polyethylene (LDPE), high density polyethylene (HDPE), polyethylene terephthalate (PET), crystalline PET, amorphous PET, polyethylene glycol terephthalate, polystyrene (PS), polyamide (PA), polyvinyl chloride (PVC), polycarbonate (PC), poly(styrene:acrylonitrile) (SAN), polymethylmethacrylate (PMMA), polypropylene (PP), polyethylene naphthalene (PEN), polyethylene furanoate (PEF), PET homopolymers, PEN copolymers, PET/PEN resin blends, PEN homopolymers, over molded thermoplastic elastomers (TPE), fluropolymers, polysulphones, polyimides, cellulose acetate, and/or combinations thereof. In some embodiments, the enclosure may be made of a metal, a ceramic, or a natural material.

The foregoing description was primarily directed to embodiments of the invention. Although some attention was given to various alternatives within the scope of the invention, it is anticipated that one skilled in the art will likely realize additional alternatives that are now apparent from disclosure of embodiments of the invention. Accordingly, the scope of the invention should be determined from the following claims and not be limited by the above disclosure.

What is claimed is:

1. A system for enclosing an energy source, the system comprising:
    an enclosure having a front wall, a rear wall, a top wall, a bottom wall, side walls, and comprising an interior compartment;
    an inlet defining an entrance to an inlet channel, the inlet channel extending from the front wall to the interior compartment, the inlet channel defined by two or more inlet segments, the two or more inlet segments being angled with respect to one another to form an indirect flow path;

an outlet channel extending from the rear wall to the interior compartment, the outlet channel defined by two or more outlet segments;

one or more energy source cells positioned within the interior compartment; and a cooling fan mounted to the inlet channel by one of the two or more inlet segments which draws air into the interior compartment, wherein the cooling fan is disposed vertically above the inlet, wherein the cooling fan operates to draw air upward through the inlet channel to the interior compartment such that air within the interior compartment is expelled downward into the interior compartment and out of the outlet channel.

2. The system of claim 1, further comprising a charger positioned within the enclosure and being electrically coupled with the one or more energy source cells.

3. The system of claim 2, further comprising a battery management system positioned within the enclosure and electrically coupled with the one or more energy source cells.

4. The system of claim 3, wherein the one or more energy source cells are positioned below the battery management system and the charger within the enclosure.

5. The system of claim 2, further comprising an electrical cord coupled with the charger.

6. The system of claim 5, further comprising a recessed compartment formed within a top wall of the enclosure, wherein the electrical cord is retractable into the compartment.

7. The system of claim 6, further comprising a wall aperture formed within a side wall of the enclosure that allows water that pools within the recessed compartment to flow out of the recessed compartment.

8. The system of claim 1, further comprising one or more drainage holes formed within the bottom wall of the enclosure.

9. The system of claim 1, wherein the one or more energy source cells includes a first energy source cell and a second energy source cell.

10. The system of claim 9, wherein the first energy source cell is a lithium ion battery cell and the second energy source cell is a lithium ion battery cell.

11. A system for enclosing an energy source for a material handling vehicle, the system comprising:

an enclosure having a first wall, a second wall different than the first wall, the enclosure comprising an interior compartment;

an inlet defining an entrance to an inlet channel, the inlet channel extending from the first wall to the interior compartment, the inlet channel defined by two or more inlet segments;

an outlet channel extending from the second wall to the interior compartment, the outlet channel defined by two or more outlet segments;

one or more energy source cells positioned within the interior compartment;

a charger positioned within the enclosure being electrically coupled with the one or more energy source cells;

a battery management system positioned within the enclosure being electrically coupled with the one or more energy source cells; and a cooling fan mounted adjacent the inlet channel by an inlet segment, the cooling fan being operative to draw air into the interior compartment, wherein the cooling fan is disposed vertically above the inlet, and wherein the cooling fan operates to draw air upward through the inlet channel to the interior compartment such that air within the interior compartment is expelled downward into the interior compartment and out of the outlet channel.

12. The system of claim 11, wherein the one or more energy source cells comprise one or more lithium ion cells.

13. The system of claim 11, further comprising one or more drainage holes within a bottom wall of the enclosure.

14. The system of claim 11, wherein the cooling fan is secured to at least one of the two or more inlet segments to allow air to pass through the at least one of the two or more inlet segments.

15. The system of claim 11, wherein the cooling fan is positioned in an upper corner of the enclosure and the one or more energy source cells are positioned in one or more lower corners of the enclosure.

16. A method of cooling an energy source comprising:

drawing air through an inlet that defines an entrance to an air inlet channel of an enclosure that is defined by at least a first wall and a second wall via a cooling fan, the inlet channel defined by two or more inlet segments and extending from the first wall to an interior compartment of the enclosure;

propelling the air, via the cooling fan, upward through the air inlet channel and downward into the interior compartment of the enclosure such that the air flows past at least one of an energy source cell, a charger, and a battery management system, the cooling fan being mounted to the inlet channel by an inlet segment; and expelling the air out of an outlet channel that extends from the second wall to the interior compartment, wherein the cooling fan is disposed vertically above the inlet, wherein the air inlet channel is defined by the two or more inlet segments, and wherein the air outlet channel is defined by two or more outlet segments.

17. The method of claim 16, further comprising:

draining moisture out of the interior compartment through one or more drainage holes positioned within a bottom wall of the enclosure.

18. The method of claim 16, further comprising:

retracting a power cord that extends from a compartment within a recessed compartment formed within a top wall of the enclosure.

19. The method of claim 18, further comprising:

draining water out of the compartment through a wall aperture formed along a side wall of the enclosure.

* * * * *